United States Patent
Ridley

(10) Patent No.: US 7,474,536 B2
(45) Date of Patent: Jan. 6, 2009

(54) AUDIO SOUND QUALITY ENHANCEMENT APPARATUS AND METHOD

(76) Inventor: Ray B. Ridley, 525 Trotters Ridge, Roswell, GA (US) 30075

( * ) Notice: Subject to any disclaimer, the term of this patent is extended or adjusted under 35 U.S.C. 154(b) by 116 days.

(21) Appl. No.: 11/177,779

(22) Filed: Jul. 8, 2005

(65) Prior Publication Data

US 2006/0006527 A1    Jan. 12, 2006

Related U.S. Application Data

(63) Continuation-in-part of application No. 10/795,052, filed on Mar. 5, 2004, now abandoned, which is a continuation of application No. 09/698,450, filed on Oct. 27, 2000, now Pat. No. 6,765,802.

(51) Int. Cl.
*H05K 7/00* (2006.01)
(52) U.S. Cl. .................. 361/760; 361/767; 174/174
(58) Field of Classification Search .......... 463/46; 435/288; 331/70; 361/704, 760, 767; 257/728; 174/17 R
See application file for complete search history.

(56) References Cited

U.S. PATENT DOCUMENTS

| | | |
|---|---|---|
| 3,258,606 A | 6/1966 | Meadoes |
| 3,383,614 A | 5/1968 | Emmons et al. |
| 3,393,328 A | 7/1968 | Meadows et al. |
| 3,882,728 A | 5/1975 | Wittlinger |
| 3,965,437 A | 6/1976 | Kim |
| 4,268,887 A | 5/1981 | Ghiringelli et al. |
| 4,320,349 A | 3/1982 | Freers et al. |
| 4,403,199 A | 9/1983 | Blackmer |
| 4,598,167 A | 7/1986 | Ushifusa et al. |
| 4,625,328 A | 11/1986 | Freadman |
| 4,885,477 A | 12/1989 | Bird et al. |
| 4,920,405 A | 4/1990 | Itoh et al. |

(Continued)

FOREIGN PATENT DOCUMENTS

JP    1-255261    10/1989

(Continued)

OTHER PUBLICATIONS 2000-082779, inventor: Miyagi Hiroshi, Date: Mar. 21, 2000, Application No. 10-267293.*

*Primary Examiner*—Jeremy C Norris
*Assistant Examiner*—Andargie M Aychillhum
(74) *Attorney, Agent, or Firm*—Peter A. Nieves, Esq.; Sheehan Phinney Bass & Green, P.A.

(57) ABSTRACT

An audio enhancement apparatus includes a thermally insulating container and a substrate mounted at least partially within the thermally insulating container. A heat source is provided within the thermally insulating container and proximate to the substrate. At least one audio semiconductor is mounted to the substrate, where the audio semiconductor is located within the thermally insulating container. The thermally insulating container, in conjunction with the heat source, maintains an above-ambient temperature for the audio semiconductor while at least partially insulating components located outside of the thermally insulating container from the heat source. Another embodiment of the audio enhancement apparatus includes a thermally conductive substrate with at least one heat source located proximate to the substrate and at least one audio semiconductor mounted to the substrate. A heat dissipation device is also mounted proximate to the substrate.

38 Claims, 11 Drawing Sheets

U.S. PATENT DOCUMENTS

| | | |
|---|---|---|
| 5,063,342 A | 11/1991 | Hughes et al. |
| 5,331,291 A | 7/1994 | D'Agostino et al. |
| 5,483,199 A | 1/1996 | Knudsen |
| 5,563,760 A | 10/1996 | Lowis et al. |
| 5,592,363 A | 1/1997 | Atarashi et al. |
| 5,635,871 A | 6/1997 | Cavigelli |
| 5,635,874 A | 6/1997 | Perrot |
| 5,770,973 A | 6/1998 | Fujisawa et al. |
| 5,815,040 A | 9/1998 | Barbetta |
| 5,869,892 A | 2/1999 | Ohtsubo et al. |
| 5,873,053 A | 2/1999 | Pricer et al. |
| 5,898,908 A | 4/1999 | Griffin et al. |
| 5,977,832 A | 11/1999 | Satyanarayana et al. |
| 5,986,508 A | 11/1999 | Nevin |
| 6,018,270 A | 1/2000 | Stuebing et al. |
| 6,058,012 A * | 5/2000 | Cooper et al. ............... 361/704 |
| 6,100,199 A | 8/2000 | Joshi et al. |
| 6,100,759 A | 8/2000 | Sirna et al. |
| 6,147,565 A * | 11/2000 | Satoh et al. .................... 331/70 |
| 6,433,309 B2 | 8/2002 | Hashimoto et al. |
| 2001/0027132 A1* | 10/2001 | Nagata et al. ................. 463/46 |
| 2005/0091988 A1* | 5/2005 | Stewart et al. ................ 62/3.1 |
| 2006/0121602 A1* | 6/2006 | Hoshizaki et al. ......... 435/288.7 |

FOREIGN PATENT DOCUMENTS

| | | |
|---|---|---|
| JP | 7/176772 | 7/1995 |
| JP | 11-312770 | 11/1999 |
| JP | 2000-223810 | 8/2000 |
| JP | 2002-359464 | 12/2002 |
| JP | 2003-163458 | 6/2003 |
| JP | 2004-87989 | 3/2004 |

* cited by examiner

```
┌─────────────────────────────────────┐
│   MOUNTING AT LEAST ONE AUDIO       │
│ SEMICONDUCTOR AND A HEAT SOURCE TO A│
│  SUBSTRATE LOCATED WITHIN A THERMALLY│
│       INSULATING CONTAINER          │
│                602                  │
└─────────────────────────────────────┘
                  │
                  ▼
┌─────────────────────────────────────┐
│   HEATING THE SUBSTRATE VIA THE HEAT│
│                SOURCE               │
│                 604                 │
└─────────────────────────────────────┘
                  │
                  ▼
┌─────────────────────────────────────┐
│    REGULATING TEMPERATURE OF THE    │
│    SUBSTRATE USING A TEMPERATURE-   │
│ MEASURING DEVICE LOCATED PROXIMATE TO│
│            THE SUBSTRATE            │
│                 606                 │
└─────────────────────────────────────┘
```

AUDIO SOUND QUALITY ENHANCEMENT APPARATUS AND METHOD

The present application is a continuation-in-part of pending U.S. patent application Ser. No. 10/795,052, filed on Mar. 5, 2004 now abandoned which is a continuation application of U.S. patent application Ser. No. 09/698,450, filed on Oct. 27, 2000 and issued as U.S. Pat. No. 6,765,802 on Jul. 20, 2004.

FIELD OF THE INVENTION

The present invention relates to audio devices and, more specifically, is related to providing enhanced sound quality.

BACKGROUND OF THE INVENTION

Before the mid-1960s, vacuum tubes were the technology used for audio amplification. Various vacuum tubes were developed for radio, television, radar, radio frequency (RF) power, audio, and specialized applications. Over several decades of design, with a limited selection of vacuum tubes, a few standard designs for audio amplification evolved. Vacuum tube power amplifiers consisted typically of a preamplifier stage, to increase a voltage signal, and an output stage, to provide power amplification. Output impedance of a vacuum tube power amplifier, without any feedback or transformers in the circuit, is limited by the characteristics of vacuum tube technology to tens or hundreds of ohms. Output transformers are usually used to lower this output impedance to provide good power transfer to low impedance loads, such as that provided in loudspeakers.

The semiconductor (transistor) revolution provided immediate advantages to the power amplifier industry over existing vacuum tube systems. Semiconductor systems are small and reliable, and they dissipate far less heat than vacuum tubes. Furthermore, transistors can be low voltage devices with low inherent impedances that eliminate the need for audio output transformers. These characteristics of semiconductors greatly reduce potential costs and eliminate the distortion effects and bandwidth limitations associated with transformers. The majority of systems and devices, which at one time relied on vacuum tubes, have been converted to semiconductors. Only a few vacuum tube types are manufactured and in regular use, predominantly in the high-end audio field.

Despite 35 years of transistor technology, and the simple task of amplifier design, there is no standardization within the industry. Audio experts have come to recognize that audio devices have inherent distortions to which the human ear is remarkably sensitive. The conventional measures of total harmonic distortion ("THD") and frequency response have proven to be inadequate in comparing one amplifier to another.

Vacuum tube systems, with their obvious drawbacks of inefficiency, heat, unreliability, size, and high impedance, still command a strong presence in the high-end audio industry. Many listeners find vacuum tube power amplifiers to be more "transparent" than semiconductor systems, meaning the vacuum tube systems are less prone to the type of semiconductor distortions that change the original characteristics of a music signal. The survival of the vacuum tube amplifier defies the logic of conventional engineering measurements to this day.

For the past two decades, designers of high-end audio equipment have focused on the task of trying to get solid-state (e.g., transistor) amplifiers to sound like vacuum tube power amplifiers. These efforts have usually focused on the measurable distortion characteristics found in many of the older vacuum tube power amplifiers. The human ear finds even-ordered harmonics to be inherently of a musical nature and some favored vacuum tube power amplifiers are rich in these harmonics. Despite these efforts, no designer has yet succeeded in duplicating the quality of sound generated by vacuum tube power amplifiers, as evidenced by the wide variety of designs and systems that are to be found in the current market and the continued survival of vacuum tube products. The high-end audio music market has not shifted to one type of transistor circuitry as the best design.

The main focus of research for the audio industry has been directed toward circuitry. Presently, most high-end manufacturers of solid-state amplifiers recommend that their equipment should be "warmed up" before critical listening, but the manufacturers have not demonstrated that sound quality is related to thermal heating of solid-state components. The recommendation to "warm up" an audio system may originate from the classical vacuum tube systems in which "warm up" was necessary for operation. Most manufacturers need to keep the external case temperatures low for safety and reliability of audio appliances, and strive to keep the semiconductors within the audio appliances below sixty degrees Celsius.

Class A amplifiers have become popular in recent years due to their enhanced sound quality. The Class A amplifiers are designed for high output device currents, which improve linearity since the amplifiers are always conducting. In addition to increasing measured linearity, Class A amplifiers also elevate temperatures of the output devices, though this is not the stated purpose of the increased current. The consensus is that the higher the bias currents, as in the Class A amplifiers, the better the sound, since the circuit becomes more linear. As the current is increased in the output stage to increase this linearity, every effort is made to keep the output device temperature low with large heat sinks. Despite these improvements, they have not enabled solid-state audio systems to obtain the same "transparency" found in vacuum tube systems. Such Class A amplifiers fail to achieve this goal because they do not raise the temperature of the output devices sufficiently and make no attempt to raise the temperature of other semiconductor devices in the amplifiers, such as those found in the preamplifier stage.

Some of the best amplifiers have become passive heat managers. These amplifiers are provided in very large packages that maintain an elevated temperature. Present amplifiers typically maintain external heat sink temperature at no more than sixty degrees Celsius, and junction temperature at no more than approximately seventy degrees Celsius. The external heat sink temperature is required to stay low for safety.

Some amplifiers contain thermal monitoring or thermal control devices to determine the temperature of output devices. These thermal control devices are utilized to ensure that the output devices do not overheat and therefore are believed to contribute to system reliability. Other thermal control devices are designed to compensate for varying bias current caused by fluctuating temperature, to maintain signal gain relatively constant.

The present trend in the audio industry is to restrict temperatures of power devices. External heat sinks are used to maintain temperatures of power devices at about sixty-five degrees Celsius or lower, in order to keep products having such power devices therein, safe to touch. Presently, no one in the audio field has directly addressed the impact of thermal characteristics on sound quality enhancement.

Thus, a heretofore unaddressed need exists in the industry to address the aforementioned deficiencies and inadequacies.

SUMMARY OF THE INVENTION

Embodiments of the present invention provide a system and method for providing sound quality enhancement.

Briefly described, in architecture, one embodiment of the system, among others, can be implemented as follows. An audio enhancement apparatus includes a thermally insulating container and a substrate mounted at least partially within the thermally insulating container. A heat source is provided within the thermally insulating container and proximate to the substrate. At least one audio semiconductor is mounted to the substrate, where the audio semiconductor is located within the thermally insulating container.

Another embodiment of the audio enhancement apparatus includes a thermally conductive substrate with at least one heat source located proximate to the substrate and at least one audio semiconductor mounted to the substrate. A heat dissipation device is also mounted proximate to the substrate.

The present invention can also be viewed as providing methods for sound quality enhancement. In this regard, one embodiment of such a method, among others, can be broadly summarized by the following steps: mounting at least one audio semiconductor to a substrate, wherein the audio semiconductor and at least part of the substrate are located within a thermally insulating container; and heating the substrate via use of a heat source.

Another embodiment of the method can be broadly summarized by the following steps: mounting at least one audio semiconductor to a substrate; mounting the substrate to at least one heat dissipation device; and heating the substrate via use of a heat source.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIG. 15 is a flowchart showing the functionality and operation of a possible implementation of the audio enhancement apparatus, in accordance with the second exemplary embodiment of the invention.

DETAILED DESCRIPTION

The present invention is an audio enhancement apparatus that provides a substantially transparent sound quality, using solid-state devices. The apparatus increases the sound quality of audio systems by operating semiconductor components involved in sound production at an elevated temperature. By operating the semiconductor components of an audio device above standard operating temperatures, the invention delivers sound quality levels previously unattainable without vacuum tubes. By operating devices in an audio path to above-ambient temperatures, while maintaining safe temperatures for both components sensitive to elevated temperatures and for an audio device housing, the present audio enhancement apparatus enables high quality audio playing and recording.

Figure 1:
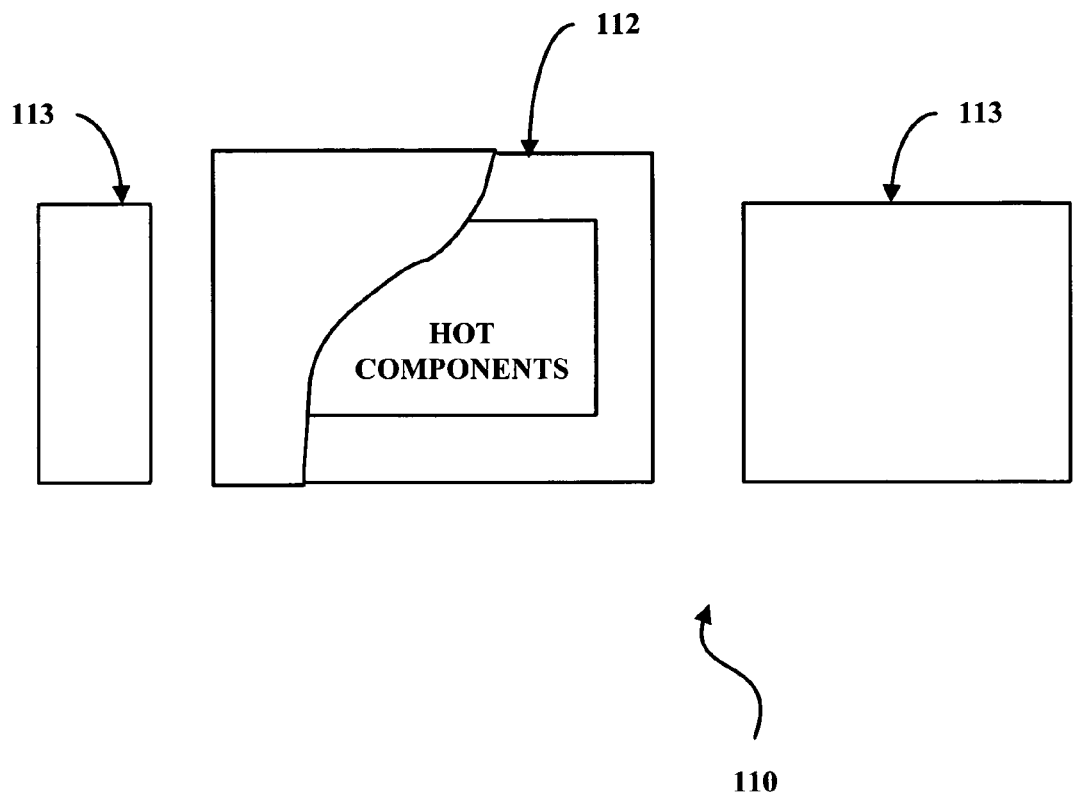
FIG. 1 is a schematic diagram illustrating general structure and use of an audio enhancement apparatus, in accordance with a first exemplary embodiment of the invention.

Referring now to FIG. 1, FIG. 1 is a schematic diagram illustrating general structure and use of an audio enhancement apparatus 110, in accordance with a first exemplary embodiment of the invention. As is shown by FIG. 1, a cut-away illustration of the audio enhancement apparatus 110 is provided showing components of the apparatus 110. The audio enhancement apparatus 110 contains a thermally insulating container 112 that keeps components (labeled as "hot components") located within the container 112 at above-ambient temperature. In addition, electrical components 113 located outside of the thermally insulating container 112 remain cool. Portions of the audio enhancement apparatus 110 are described in further detail hereafter.

Figure 2:
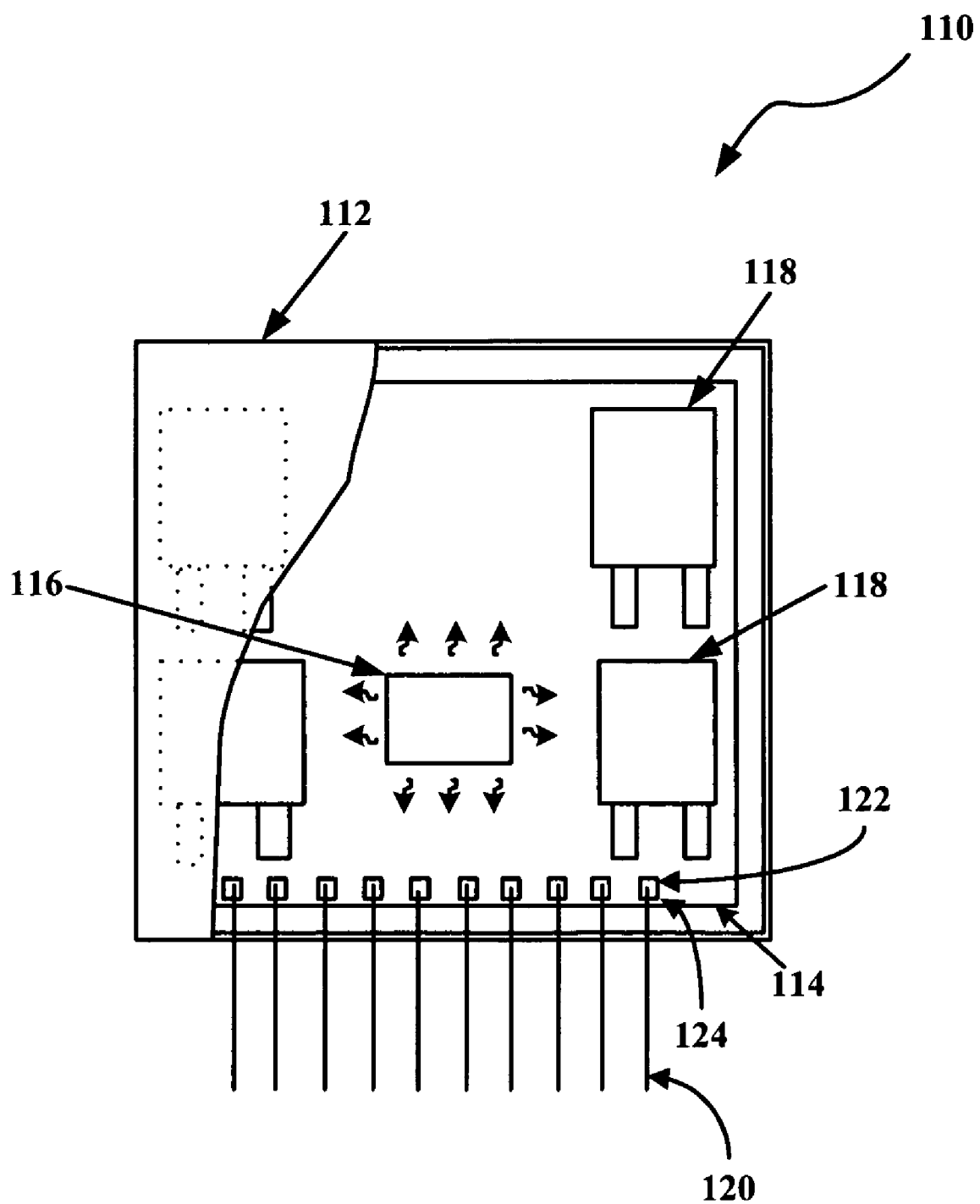
FIG. 2 is a partial cut-away view of the audio enhancement apparatus of FIG. 1, in accordance with the first exemplary embodiment of the invention.

Referring now to FIG. 2, the audio enhancement apparatus 110 of FIG. 1 is further illustrated as a partial cut-away view, in accordance with the first exemplary embodiment of the invention. The audio enhancement apparatus 110 includes the thermally insulating container 112.

A substrate 114 is mounted at least partially within the thermally insulating container 112. A heat source 116 is provided within the thermally insulating container 112 and is located proximate to the substrate 114. At least one audio semiconductor 118 (four are shown) is mounted to the substrate 114. It should be noted that the audio semiconductors 118 described herein may be mounted to the substrate 114 as a conventional high temperature package. Alternatively, the audio semiconductors 118 may be mounted to the substrate 114 as bare dice with wire bond or other attachment technology. In addition, more or less than four audio semiconductors 118 may be provided.

The thermally insulating container 112 has several functions. The thermally insulating container 112 insulates components (i.e., the audio semiconductors 118) within the container 112, which are to be heated, from ambient temperature.

The thermally insulating container 112 also minimizes heat dissipation from within the container 112. Minimizing heat dissipation from within the thermally insulating container 112 reduces the amount of heat required to maintain an above-ambient temperature of the audio semiconductor 118, thereby allowing the heat source 116 to operate more efficiently. The thermally insulating container 112 prevents components located outside of the container 112, which are not to be heated, from being heated by the heat source 116. The thermally insulating container 112 insulates an exterior of an audio device, in which the audio enhancement apparatus 110 is located, such as a housing, from the heat source 116, such that the exterior of the audio device may remain at a safe temperature for handling and may otherwise avoid putting the environment surrounding the audio device at risk as a result of heat provided by the heat source 116. Items in the environment surrounding the audio device that would otherwise be put at risk may include, but are not limited to, temperature sensitive electronics, flammable objects, and people.

The thermally insulating container 112 may be designed with additional features. As an example, the thermally insulating container 112 may be designed to be electrically insulating. The thermally insulating container 112 may be, for instance, constructed substantially from a high temperature, electrically-insulating material, such as TEFLON®. The thermally insulating container 112 may be designed with one or more apertures 122 to allow wires 120, or lead lines, to conduct power or transmit signals between electronic components, (i.e., the audio semiconductors 118) within the thermally insulating container 112 and components exterior to the thermally insulating container 112, which may operate, for instance, at ambient temperature. Once the necessary wires 120 have been run, the space within the apertures 122 may be at least partially filled with another thermally insulating material 124 to minimize temperature dissipation. Many variations and modifications may be made to the above-described thermally insulating container 112 without departing substantially from the spirit and principles of the invention.

The substrate 114 may conform to a variety of designs and permutations. As an example, the substrate 114 may be thermally conductive, thereby spreading and equalizing heat to components. While the thermally insulating container 112 at least partially equalizes the heat throughout the thermally insulating container 112, making the substrate 114 thermally conductive may serve to further and more quickly equalize the heating. The substrate 114 should be constructed of a material that can withstand high temperatures with minimal deformation or other physical effect, such that the substrate 114 provides heat conduction to at least a portion of the elements located on the substrate 114, while providing electrical isolation to all components. The substrate 114 may include, for instance, metal substrate circuit boards or ceramic-based substrate circuit boards, which can withstand high temperatures. A metal substrate circuit board may be, for example, copper or aluminum, although other metals are also viable. The substrate 114 may be located on an amplifying output stage of an audio circuit. Many variations and modifications may be made to the above-described substrate 114 without departing substantially from the spirit and principles of the invention.

The heat source 116 may include a variety of conventional heating elements known to those having ordinary skill in the art, such as, but not limited to, a resistive heater. The heat source 116 may be an integral portion of an audio semiconductor 118 or the heat source 116 may be external to the audio semiconductor 118, as shown in FIG. 2. In accordance with the first exemplary embodiment of the invention, the heat source 116 is located on the substrate 114 and, therefore located proximate to the audio semiconductors 118 mounted thereon. If the substrate 114 is thermally conductive, mounting the heat source 116 proximate to the substrate 114 further serves the purpose of allowing the substrate 114 to transmit heat from the heat source 116 to the audio semiconductors 118. Many variations and modifications may be made to the above-described heat source 116 without departing substantially from the spirit and principles of the invention.

The audio semiconductor 118 may include any electronic component in the audio enhancement apparatus 110 whose performance is enhanced at above-ambient temperatures. As an example, the audio semiconductor 118 may include junction field effect transistors, ("JFETs"), metal oxide semiconductor field effect transistors ("MOSFETs"), bipolar junction transistors ("BJTs"), or other amplifying devices. A plurality of audio semiconductors 118 may form amplifying circuit arrangements, such as cascode, differential pairs, or other arrangements. In differential amplifying arrangements for low and high level signals, audio semiconductor 118 components may be heated. Audio semiconductors 118 in both the input and output stages may be heated. Many variations and modifications may be made to the above-described audio semiconductors 118 without departing substantially from the spirit and principles of the invention.

Figure 3:
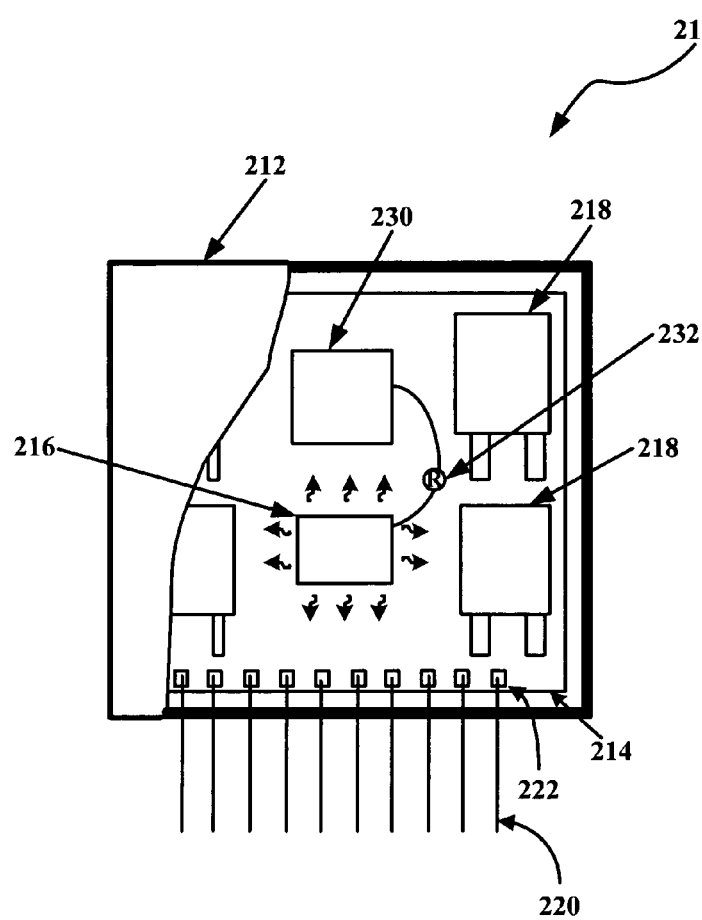
FIG. 3 is a top view of an audio enhancement apparatus having a partially removed insulating container cover, in accordance with a second exemplary embodiment of the invention.
Figure 4:
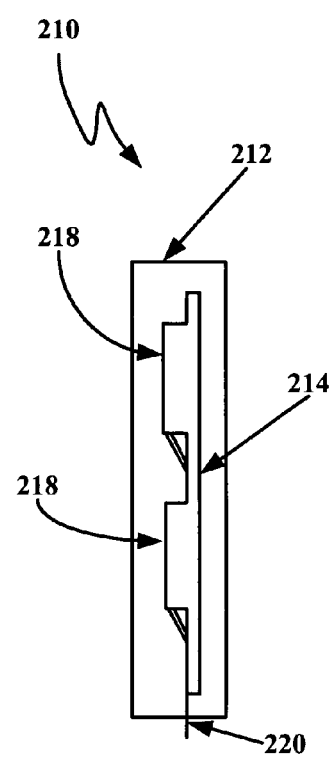
FIG. 4 is a side cross-sectional view of the apparatus of FIG. 3.

Referring now to FIG. 3 and FIG. 4, a second exemplary embodiment of an audio enhancement apparatus 210 is schematically shown. FIG. 3 is a top view of the audio enhancement apparatus 210 having a partially removed insulating container 212 cover, in accordance with a second exemplary embodiment of the invention. FIG. 4 is a side cross-sectional view of the apparatus 210 shown in FIG. 3, in accordance with the second exemplary embodiment of the invention. The audio enhancement apparatus 210 includes a thermally insulating container 212. A substrate 214 is mounted at least partially within the thermally insulating container 212. A heat source 216 is provided within the thermally insulating container 212 and is located proximate to the substrate 214. At least one audio semiconductor 218 (four are shown) is mounted to the substrate 214. A temperature-measuring device 230 is located within the thermally insulating container 212 and is located proximate to the substrate 214. In the second exemplary embodiment, the temperature-measuring device 230 is shown mounted to the substrate 214, although the temperature-measuring device 230 may be mounted elsewhere within the thermally insulating container 212. A feedback regulator 232 is electrically connected to the heat source 216 and the temperature-measuring device 230, whereby the feedback regulator 232 controls the heat source 216.

The feedback regulator 232, in conjunction with the temperature-measuring device 230 and the heat source 216, allows greater control over maintaining a temperature within the thermally insulating container 212. The temperature-measuring device 230 may be a sensor located within the thermally insulating container 212 that measures the temperature and transmits the temperature information to the feedback regulator 232. The feedback regulator 232 may have a preset, desired temperature to which it compares the temperature transmitted from the temperature-measuring device 230 and, based on that comparison, may cause the heat source 216 to initiate, cease operation, or otherwise modify operation to an extent that the heat source 216 may have modifiable operations. Many variations and modifications may be made to the above-described feedback design without departing substantially from the spirit and principles of the invention.

The thermally insulating container 212 may be designed with one or more apertures 222 to allow wires 220 to conduct power or transmit signals between the electronic components within the thermally insulating container 212 and components exterior to the thermally insulating container 212, which may operate, for instance, at ambient temperature.

Figure 5:
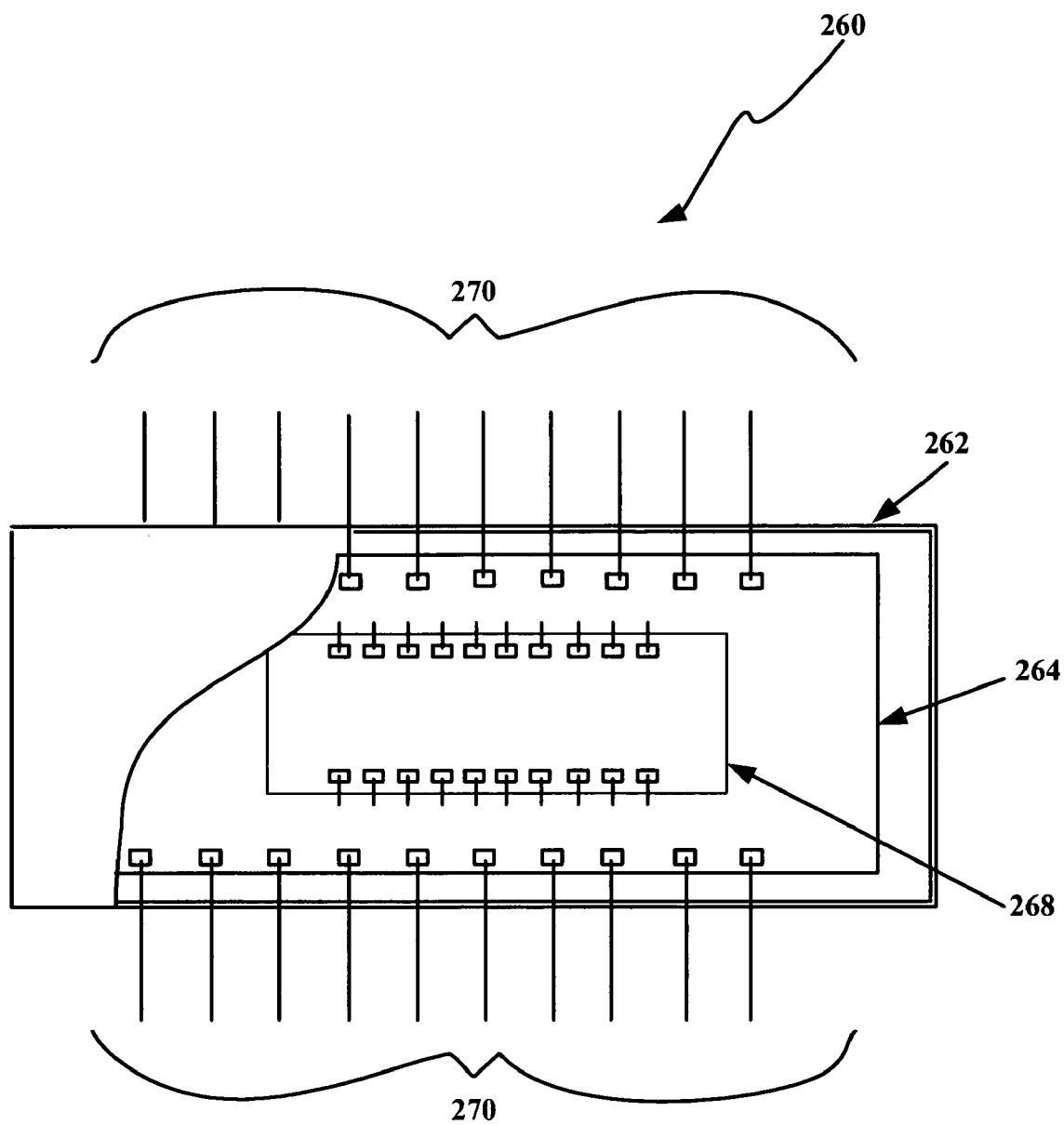
FIG. 5 is a top view of an audio enhancement apparatus having a partially removed insulating container cover, in accordance with a third exemplary embodiment of the invention.

Referring now to FIG. 5, a third exemplary embodiment of an audio enhancement apparatus 260 is schematically shown.

FIG. 5 is a top view of the audio enhancement apparatus 260 having a partially removed insulating container 262 cover, in accordance with the third exemplary embodiment of the invention. The audio enhancement apparatus 260 includes a substrate 264 mounted at least partially within the thermally insulating container 262. One or more integrated circuits 268 is provided on the substrate 264 (one is shown). A heat source, as described herein above, is provided within the integrated circuit 268. A temperature-measuring device and a feedback regulator, as described herein above, may also be located within the integrated circuit 268. The feedback regulator is electrically connected to the heat source and the temperature-measuring device, whereby the feedback regulator controls the heat source.

The feedback regulator, in conjunction with the temperature-measuring device and the heat source, allows greater control over maintaining a temperature within the thermally insulating container 262. The temperature-measuring device may be a sensor located within the integrated circuit 268 that measures the temperature and transmits the temperature information to the feedback regulator. The feedback regulator may have a preset, desired temperature to which it compares the temperature transmitted from the temperature-measuring device and, based on that comparison, may cause the heat source to initiate, cease operation, or otherwise modify operation to an extent the heat source may have modifiable operations. Many variations and modifications may be made to the above-described feedback loop design without departing substantially from the spirit and principles of the invention.

It should be noted that if there is more than one integrated circuit, a second of the integrated circuits 268 may have audio semiconductors thereon, thereby separating the audio devices from the temperature-measuring device, heat source, and feedback regulator. Of course, any other configuration is also possible and within the teachings of the present detailed description.

The thermally insulating container 262 may be designed with one or more apertures to allow wires 270, or lead lines, to conduct power or transmit signals between the electronic components within the thermally insulating container 262 and electrical components exterior to the thermally insulating container 262, which may operate, for instance, at ambient temperature.

In the third exemplary embodiment, the audio enhancement apparatus 260 is shown having one integrated circuit 268 mounted to the substrate 264. Variations on the third exemplary embodiment include having multiple integrated circuits 268 with the various components distributed among the integrated circuits 268. The third exemplary embodiment may be, for example, implemented with Silicon technology, Silicon carbide technology, germanium technology, or other types of solid-state technology.

Figure 6:
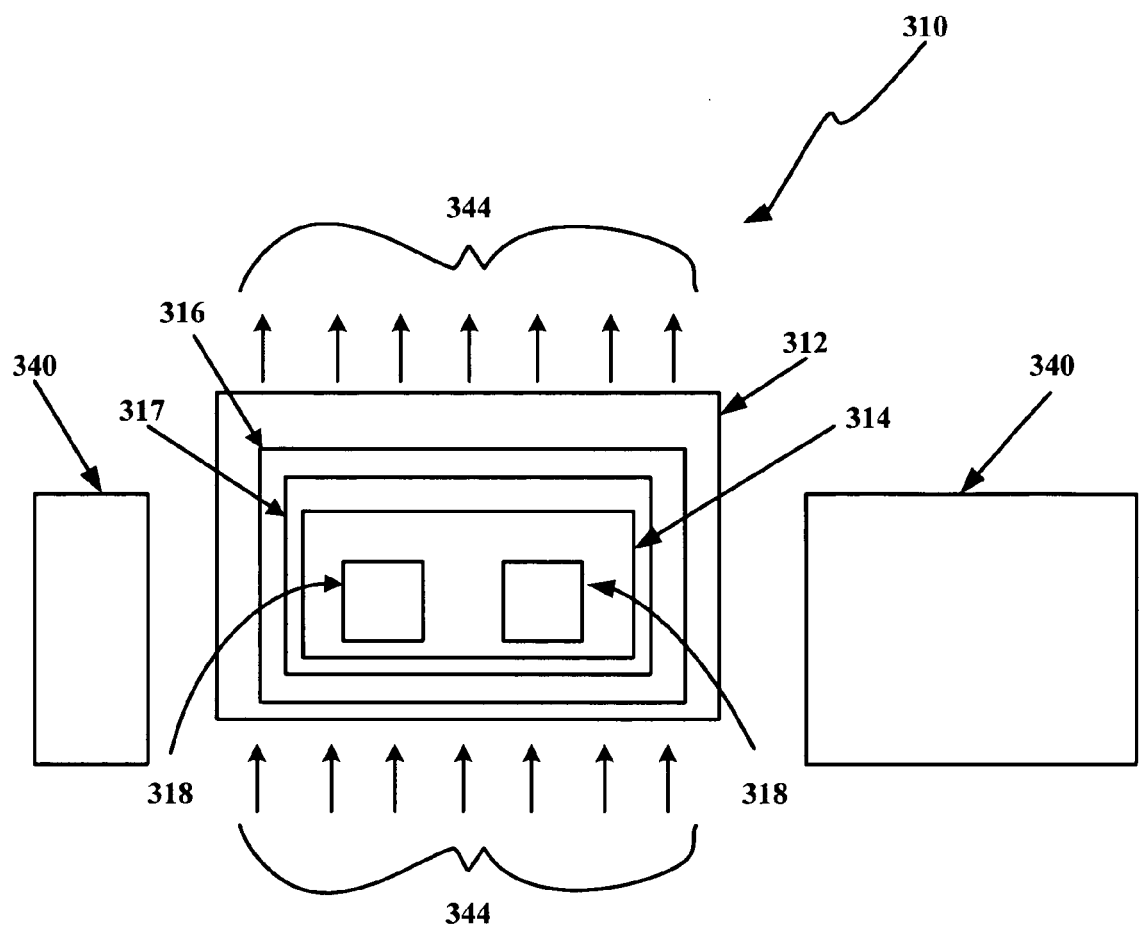
FIG. 6 is a side view of an audio enhancement apparatus, in accordance with a fourth exemplary embodiment of the invention.

Referring now to FIG. 6, a fourth exemplary embodiment of an audio enhancement apparatus 310 is schematically shown. FIG. 6 is a side view of the audio enhancement apparatus 310, in accordance with the fourth exemplary embodiment of the invention. The audio enhancement apparatus 310 contains an airflow management device 312 for controlling the flow of air 344 through an airflow management device 312. It should be noted that different airflow management devices are discussed in detail below. Within the airflow management device 312 is a heat dissipation device 316. As is described in detail herein, the heat dissipation device 316 may be, for example, a heat sink.

Attached to the heat dissipation device 316 is a substrate 314, on which components that become hot are located. As with regard to earlier described embodiments, these components may be one or more integrated circuits 318.

Optionally, a thermal insulator 317 may be located between the substrate 314 and the heat dissipation device 316. An example of the thermal insulator 317 is described in detail below.

In accordance with the fourth exemplary embodiment of the invention, non-heated circuit components 340 are located outside of the audio enhancement apparatus 310 and airflow management device 312. The non-heated circuit components 340 may operate more efficiently at ambient temperature. The audio enhancement apparatus 310 of the fourth exemplary embodiment may be, for example, implemented with Silicon technology, Silicon carbide technology, germanium technology, or other types of solid-state technology.

Figure 7:
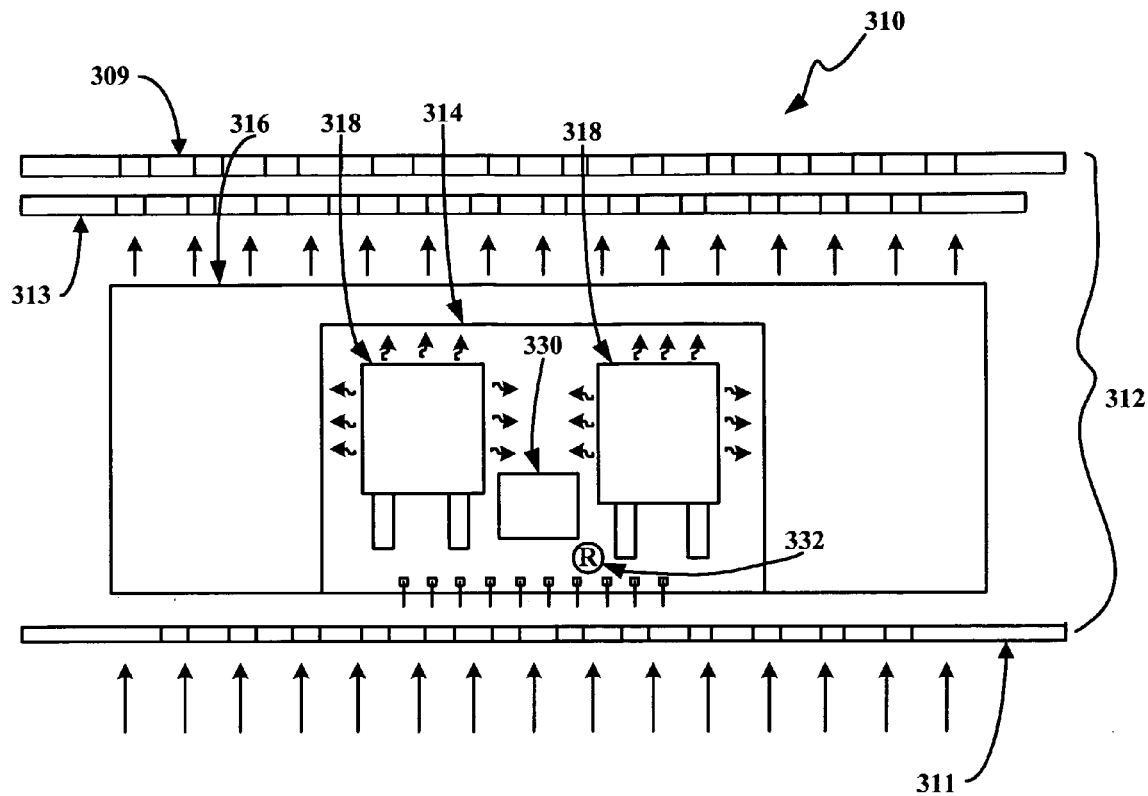
FIG. 7 is a side view further illustrating the audio enhancement apparatus of FIG. 6, in accordance with the fourth exemplary embodiment of the invention.
Figure 8:
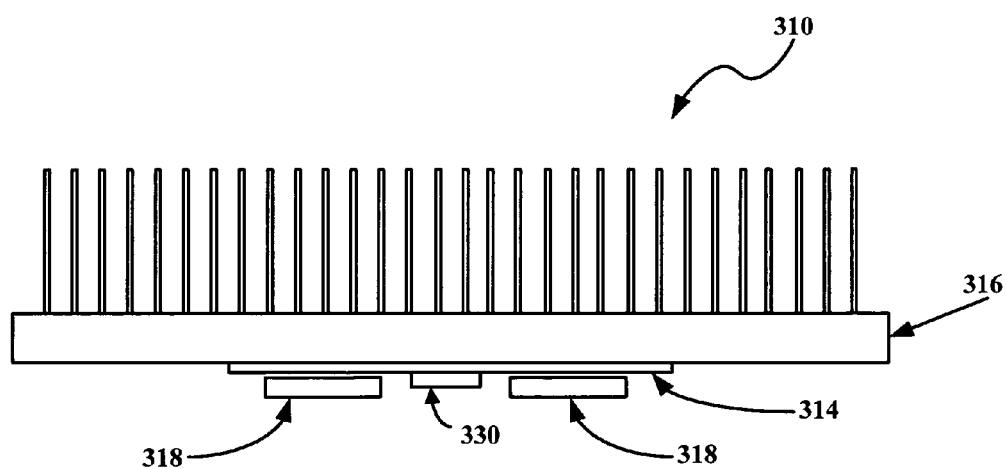
FIG. 8 is a top view of the audio enhancement apparatus of FIG. 7, without an airflow management device.

FIG. 7 is a side view further illustrating the audio enhancement apparatus 310 of FIG. 6, in accordance with the fourth exemplary embodiment of the invention. In addition, FIG. 8 is a top view of the audio enhancement apparatus 310 of FIG. 7, without the airflow management device 312 illustrated. Referring to FIG. 7, the audio enhancement apparatus 310 includes the airflow management device 312 having controllable air flow vents 313 therein, a vented top cover 309 and a vented bottom cover 311. The airflow management device 312 is further described herein.

The following describes portions of the audio enhancement apparatus 310 that are located within the airflow management device 312. It should be noted that in accordance with an alternative embodiment of the invention, the audio enhancement apparatus 310 may not have an airflow management device 312.

Returning to the description of FIG. 7, the audio enhancement apparatus 310 also contains a heat sink 316. The substrate 314 is connected to the heat sink 316. At least one audio semiconductor 318 (two are shown) is mounted to the substrate 314. In the fourth exemplary embodiment of the invention no independent heat source is provided, although the audio semiconductors 318 generate heat during normal operation. As a further example, a heat source may be located within one of the audio semiconductors 318. Further, a bias current in the audio semiconductors 318 may be used as a heat source. A temperature-measuring device 330 is located proximate to the substrate 314. In accordance with the fourth exemplary embodiment of the invention, the temperature-measuring device 330 is shown mounted to the substrate 314, although the temperature-measuring device 330 may be mounted elsewhere proximate to the substrate 314 or close to the substrate 314.

A feedback regulator 332 is electrically connected to the airflow vents 313 and the temperature-measuring device 330, whereby the feedback regulator 332 is capable of opening and closing the airflow vents 313 via technology known to those having ordinary skill in the art. In this manner, the temperature-measuring device 330 and feedback regulator 332 can cause openings of the airflow vents 313 when the temperature-measuring device 330 senses a temperature above a desired temperature, and can close the airflow vents 313 when the temperature-measuring device 330 senses a temperature below a desired temperature.

The temperature-measuring device 330 may be a sensor located proximate to the substrate 314 that measures the temperature and transmits the temperature information to the feedback regulator 332. The feedback regulator 332 may have a preset, desired temperature to which it compares the temperature transmitted from the temperature-measuring device 330 and, based on that comparison, may cause the airflow vents 313 to open or close. Many variations and modifications may be made to the above-described feedback design without departing substantially from the spirit and principles of the invention.

The fourth exemplary embodiment may be, for example, implemented with Silicon technology, Silicon carbide technology, germanium technology, or other types of solid-state technology. In addition, it should be noted that the combination of the heat sink 316 and the controlled vents 313 is used to cool the substrate 314 and the audio semiconductors 318 located within the airflow management device 312.

Figure 9:
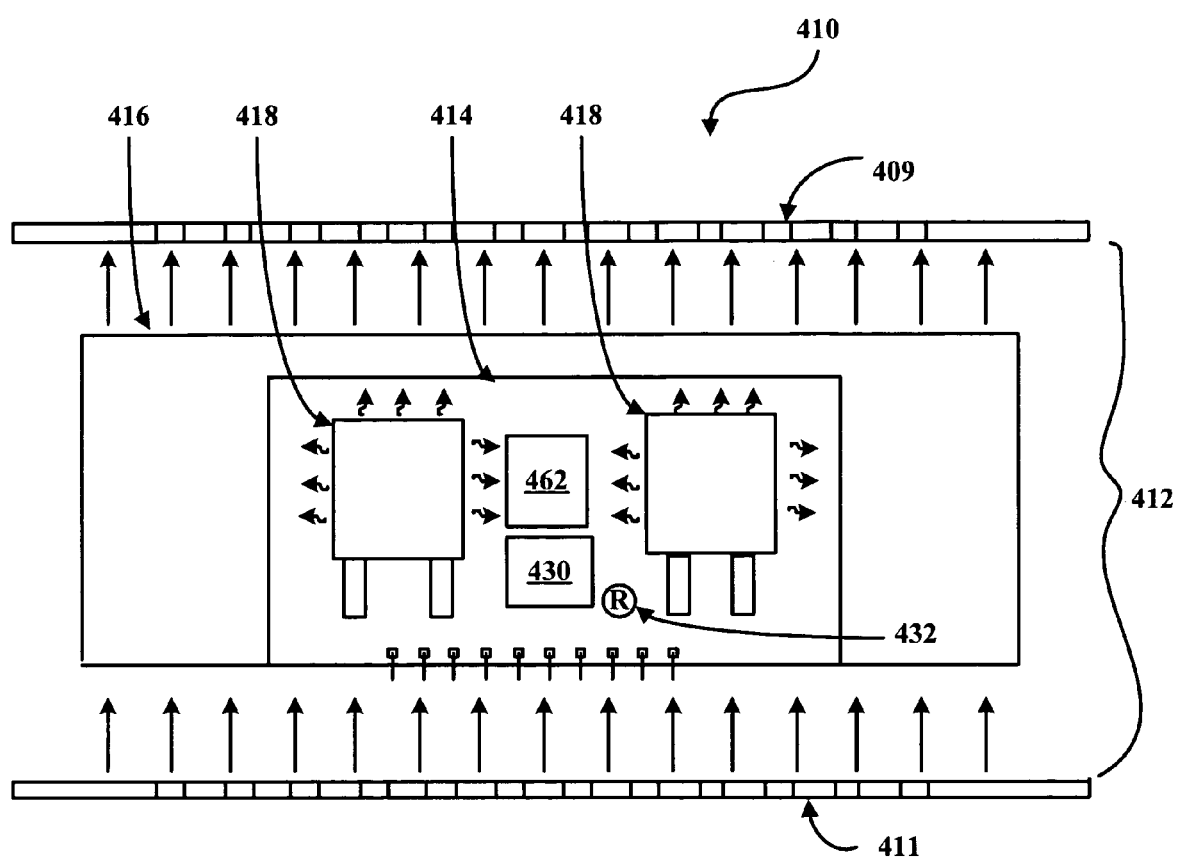
FIG. 9 is a side view further illustrating the audio enhancement apparatus of FIG. 6, in accordance with a fifth exemplary embodiment of the invention

FIG. 9 is a side view further illustrating the audio enhancement apparatus 410 of FIG. 6, in accordance with a fifth exemplary embodiment of the invention. It should be noted that the main differences between the audio enhancement apparatus 310 of the fourth exemplary embodiment of the invention and the audio enhancement apparatus 410 of the fifth exemplary embodiment of the invention is that the fifth exemplary embodiment of the invention contains a separate heat source 462 and does not contain controlled vents.

Referring to FIG. 9, the audio enhancement apparatus 410 includes an airflow management device 412 having a vented top cover 409 and a vented bottom cover 411 therein. The airflow management device 412 is further described herein. The following describes portions of the audio enhancement apparatus 410 that are located within the airflow management device 412. It should be noted that in accordance with an alternative embodiment of the invention, the audio enhancement apparatus 410 may not have an airflow management device 412.

Returning to the description of FIG. 9, the audio enhancement apparatus 410 also contains a heat sink 416. The substrate 414 is connected to the heat sink 416. At least one audio semiconductor 418 (two are shown) is mounted to the substrate 414. In the fifth exemplary embodiment of the invention an independent heat source 462 is provided, although the audio semiconductors 418 may also generate heat during normal operation. Further, a bias current in the audio semiconductors 418 may be used as a heat source.

A temperature-measuring device 430 is located proximate to the substrate 414. In accordance with the fifth exemplary embodiment of the invention, the temperature-measuring device 430 is shown mounted to the substrate 414, although the temperature-measuring device 430 may be mounted elsewhere proximate to the substrate 414 or close to the substrate 414.

A feedback regulator 432 is electrically connected to the temperature-measuring device 430. The temperature-measuring device 430 may be a sensor located proximate to the substrate 414 that measures the temperature and transmits the temperature information to the feedback regulator 432. The feedback regulator 432 may have a preset, desired temperature to which it compares the temperature transmitted from the temperature-measuring device 430 and, based on that comparison, the feedback regulator 432 may cause the heat source 462 to initiate, cease operation, or otherwise modify operation to an extent the heat source 462 may have modifiable operations. Many variations and modifications may be made to the above-described feedback design without departing substantially from the spirit and principles of the invention.

The fifth exemplary embodiment may be, for example, implemented with Silicon technology, Silicon carbide technology, germanium technology, or other types of solid-state technology. In addition, it should be noted that the heat sink 416 acts to cool the substrate 414 and the audio semiconductors 418 located within the airflow management device 412.

Figure 10:
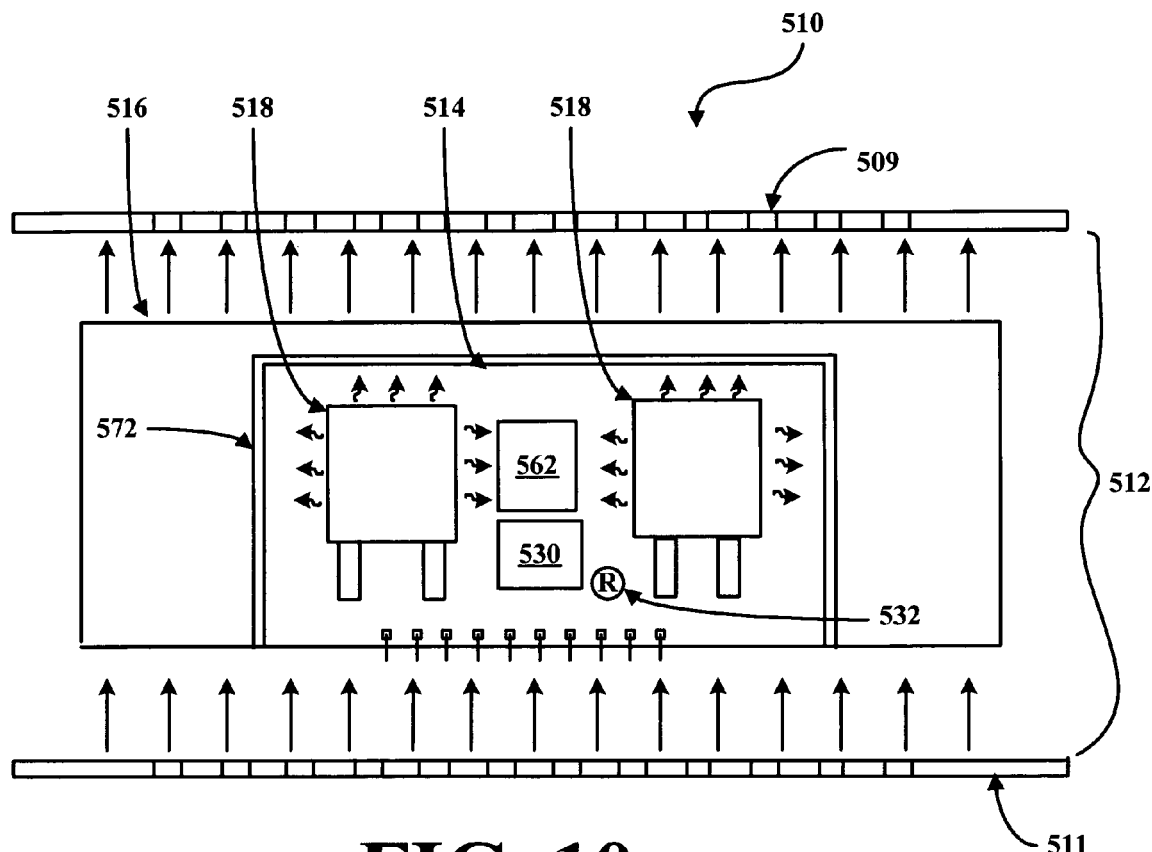
FIG. 10 is a side view illustrating an audio enhancement apparatus, in accordance with a sixth exemplary embodiment of the invention.
Figure 11:
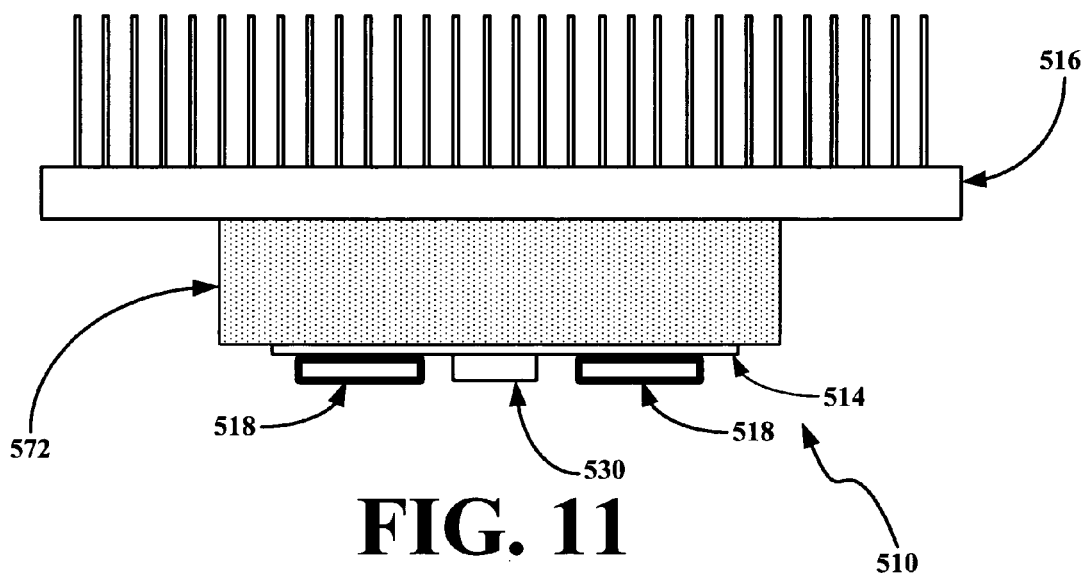
FIG. 11 is a top view of the audio enhancement apparatus of FIG. 10, without an airflow management device.

FIG. 10 is a side view illustrating an audio enhancement apparatus 510, in accordance with a sixth exemplary embodiment of the invention. In addition, FIG. 11 is a top view of the audio enhancement apparatus 510 of FIG. 10, without an airflow management device 512 illustrated. It should be noted that the main differences between the audio enhancement apparatus 410 of the fifth exemplary embodiment of the invention and the audio enhancement apparatus 510 of the sixth exemplary embodiment of the invention is that the sixth exemplary embodiment of the invention contains a thermally controlled interface 572.

Referring to FIG. 10, the audio enhancement apparatus 510 includes an airflow management device 512 having a vented top cover 509 and a vented bottom cover 511. The airflow management device 512 is further described herein. The following describes portions of the audio enhancement apparatus 510 that are located within the airflow management device 512. It should be noted that in accordance with an alternative embodiment of the invention, the audio enhancement apparatus 510 may not have an airflow management device 512.

Returning to the description of FIG. 10, the audio enhancement apparatus 510 also contains a heat sink 516. The substrate 514 is connected to the heat sink 516. At least one audio semiconductor 518 (two are shown) is mounted to the substrate 514. In the sixth exemplary embodiment of the invention, like the fifth exemplary embodiment of the invention, an independent heat source 562 is provided, although the audio semiconductors 518 may also generate heat during normal operation. Further, a bias current in the audio semiconductors 518 may be used as a heat source.

A temperature-measuring device 530 is located proximate to the substrate 514. In accordance with the sixth exemplary embodiment of the invention, the temperature-measuring device 530 is shown mounted to the substrate 514, although the temperature-measuring device 530 may be mounted elsewhere proximate to the substrate 514 or close to the substrate 514.

A feedback regulator 532 is electrically connected to the temperature-measuring device 530. The temperature-measuring device 530 may be a sensor located proximate to the substrate 514 that measures the temperature and transmits the temperature information to the feedback regulator 532. The feedback regulator 532 may have a preset, desired temperature to which it compares the temperature transmitted from the temperature-measuring device 530 and, based on that comparison, the feedback regulator 532 may cause the heat source 562 to initiate, cease operation, or otherwise modify operation to an extent the heat source 562 may have modifiable operations. Many variations and modifications may be made to the above-described feedback design without departing substantially from the spirit and principles of the invention.

A thermally controlled interface 572 may be provided between the substrate 514 and the heat sink 516 to provide variable cooling. Alternatively, the audio enhancement apparatus 510 may be provided with a fan 622 (FIG. 12) in electrical communication with the feedback regulator 532 to further control cooling of the substrate 514.

The sixth exemplary embodiment may be, for example, implemented with Silicon technology, Silicon carbide technology, germanium technology, or other types of solid-state technology. In addition, it should be noted that the heat sink 516 cools the substrate 514 and the audio semiconductors 518 located within the airflow management device 512.

Figure 12:
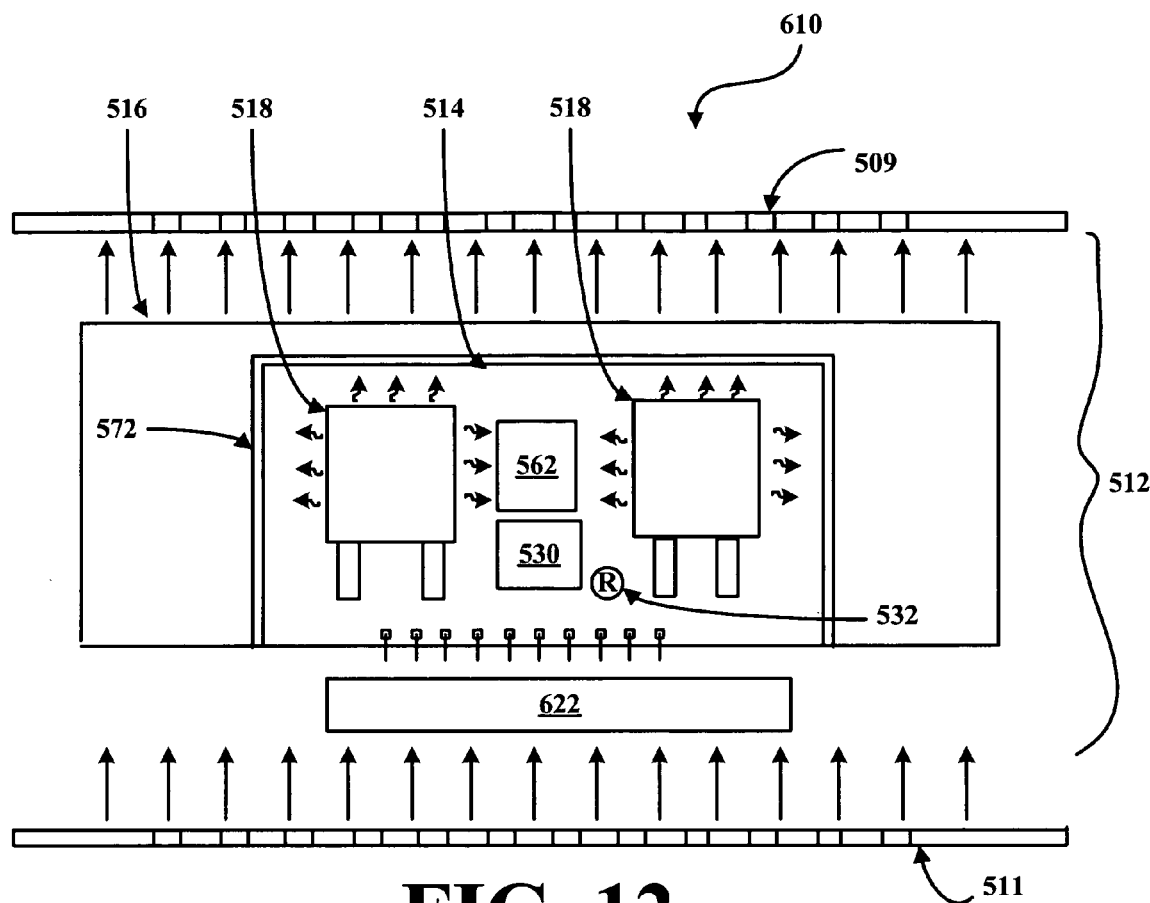
FIG. 12 is a side view further illustrating the audio enhancement apparatus, of FIG. 10, in accordance with a seventh exemplary embodiment of the invention.
Figure 13:
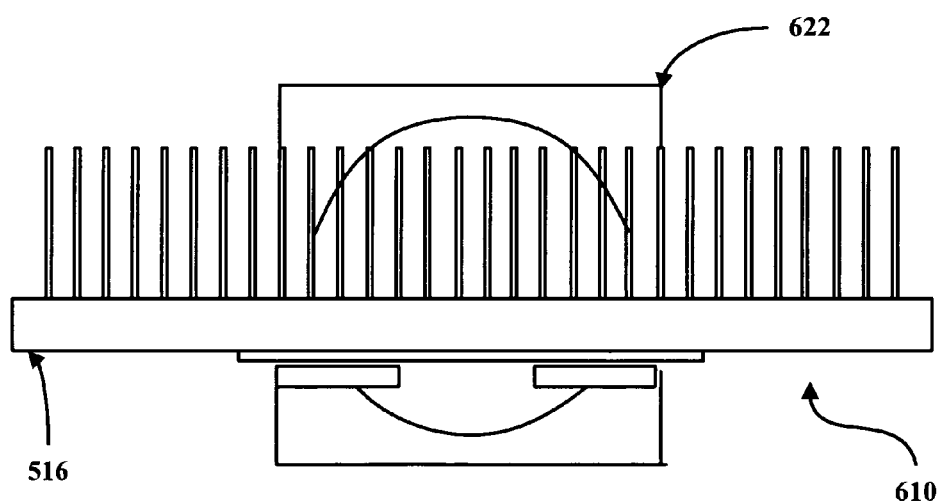
FIG. 13 is a top view of the audio enhancement apparatus of FIG. 12, without an airflow management device.

FIG. 12 is a side view further illustrating the audio enhancement apparatus 610, of FIG. 10, in accordance with a seventh exemplary embodiment of the invention. In addition, FIG. 13 is a top view of the audio enhancement apparatus 610 of FIG. 12, without an airflow management device 512 illustrated. It should be noted that the main differences between the audio enhancement apparatus 510 of the sixth exemplary embodiment of the invention and the audio enhancement apparatus 610 of the seventh exemplary embodiment of the invention is that the seventh exemplary embodiment of the invention contains a fan 622. As has been mentioned above, the fan 622 is in electrical communication with the feedback regulator 532 to further control cooling of the substrate 514.

Figure 14:
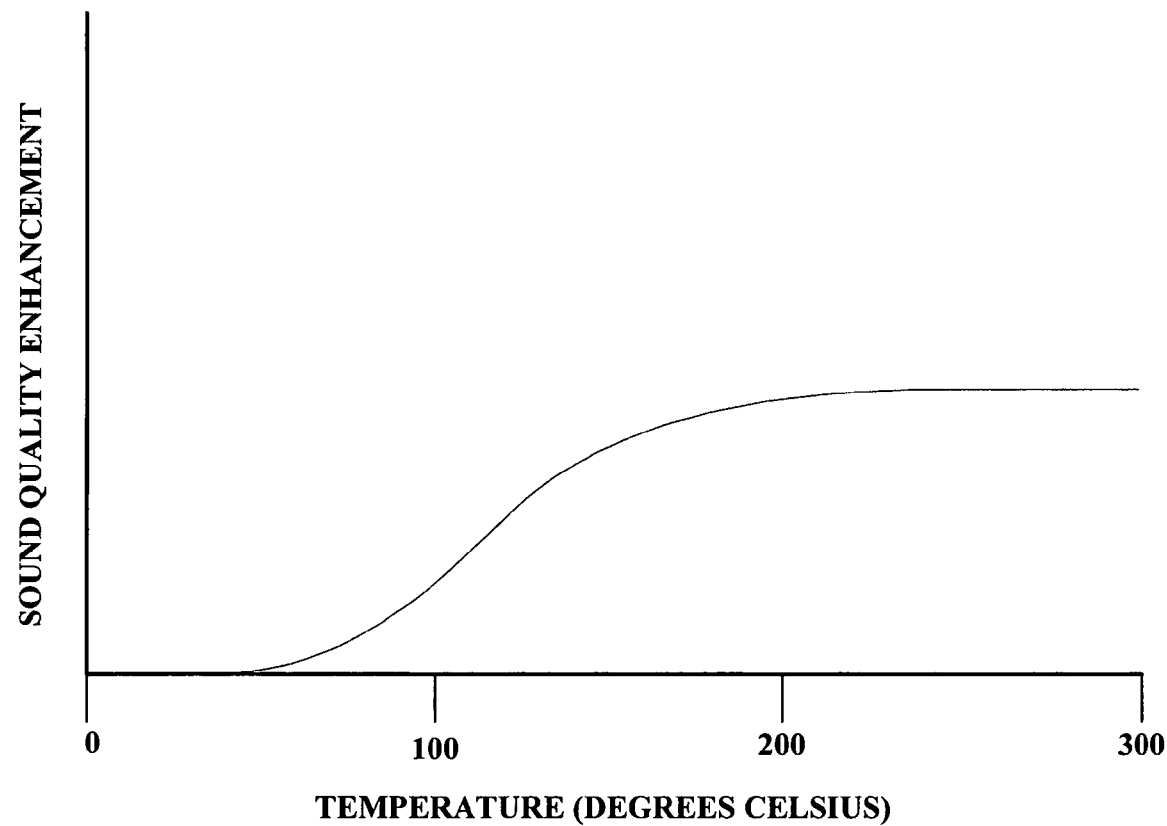
FIG. 14 is a graphical representation of relative sound quality enhancement versus solid-state component temperature.

FIG. 14 is a graphical representation of the relative sound quality enhancement versus solid-state component temperature as provided by the present invention. Several audiophiles evaluated the sound quality enhancement that was discernable at varying temperatures of the audio semiconductor components in an audio system wherein heating was provided in accordance with the invention. Below temperatures of fifty-five degrees Celsius, little change in sound quality was detected according to polling opinion of the audiophiles. A slight increase in sound quality was found within the temperature range of fifty-five degrees Celsius to seventy-five degrees Celsius. Above seventy-five degrees Celsius, and particularly above eighty degrees Celsius, the sound quality increased further, up to one hundred degrees Celsius. The sound enhancement achieved near one hundred degrees Celsius was thought to approach the sound transparency generated by tube systems. Additional experiments have suggested that temperatures above one hundred degrees Celsius result in even better sound enhancement qualities. Temperatures of at least one hundred degrees Celsius, two hundred degrees Celsius, and three hundred degrees Celsius are within the scope of this invention. The limiting factor of a particular transistor for such heating is the heat damage threshold of the transistor. Otherwise, heating to that threshold is contemplated and may, given the circuit at issue, be desirable. It should be noted that such heat damage thresholds for certain modern solid-state components are above two hundred degrees Celsius. However, it is contemplated that such thresholds will continue to increase and such increases, though possibly not presently available, are still within the scope of this invention. Presently, an upper temperature limit to the sound enhancement effect provided by the invention is limited to the material limitations of the components of the audio enhancement apparatus.

The audio enhancement apparatus may be used in conjunction with microphones, microphone preamps, phono preamplifiers, compact disk players, digital video disk players, amplifiers, line stages, audio mixing boards, televisions, video cassette recorders, or any other devices utilizing circuits designed for recording sound or projecting sound.

The flowchart of FIG. 15 shows the functionality and operation of a possible implementation of the audio enhancement apparatus, in accordance with the second exemplary embodiment of the invention, to improve the performance of an audio circuit. In this regard, each block represents a module, segment, or step, which comprises one or more instructions for implementing the specified function. It should also be noted that in some alternative implementations, the functions noted in the blocks might occur out of the order noted in FIG. 15. For example, two blocks shown in succession in FIG. 15 may in fact be executed substantially concurrently or the blocks may sometimes be executed in the reverse order, depending upon the functionality involved, as will be further clarified herein.

As shown in FIG. 15, a method 600 for improving performance of an audio circuit includes mounting at least one audio semiconductor 218 and a heat source 216 to a substrate 214, each located within a thermally insulating container 212 (block 602). The method 600 also includes heating the substrate 214 via the heat source 216 (block 604).

The method 600 may further include regulating a temperature of the substrate 214 using a temperature-measuring device 230 located proximate to the substrate 214 (block 606). A feedback regulator 232 may be used in conjunction with the temperature-measuring device 230 and the heat source 216 to allow greater control over maintaining temperature within the thermally insulating container 212.

It should be noted that the elements described herein as being a portion of the audio enhancement apparatus, may be implemented with plastic material to provide a sealed overall package. One having ordinary skill in the art would understand how to provide such a sealed overall package.

It should be emphasized that the above-described embodiments of the present invention, are merely possible examples of implementations, merely set forth for a clear understanding of the principles of the invention. Many variations and modifications may be made to the above-described embodiments of the invention without departing substantially from the spirit and principles of the invention. All such modifications and variations are intended to be included herein within the scope of this disclosure and the present invention and protected by the following claims.

What is claimed is:

1. An apparatus, comprising:
 a thermally insulating container for maintaining heat therein;
 a substrate at least partially located within the thermally insulating container;
 a heat source located within the thermally insulating container and proximate to the substrate, wherein the heat source intentionally increases heat within the thermally insulating container; and
 at least one audio semiconductor directly mounted to a surface of the substrate and having a desired high operating temperature, wherein the audio semiconductor is located within the thermally insulating container and the heat source heats the substrate to put the audio semiconductor in the desired operating temperature.

2. The apparatus of claim 1, further comprising:
 a temperature measuring device located within the thermally insulating container and proximate to the substrate; and
 a feedback regulator electrically connected to the heat source and the temperature measuring device, whereby the feedback regulator controls the heat source in accordance with temperature taken by said temperature measuring device.

3. The apparatus of claim 2, wherein the at least one audio semiconductor, the heat source, the temperature measuring device, and the feedback regulator are contained within at least one integrated circuit of at least one integrated circuit package.

4. The apparatus of claim 1, further comprising a plurality of circuit components located external to the thermally insulating container, whereby the plurality of circuit components operate at approximately ambient temperature.

5. The apparatus of claim 1, wherein the heat source is a second audio semiconductor.

6. The apparatus of claim 1, wherein at least one of the at least one audio semiconductor is used within a device selected from the group consisting of microphones, microphone preamps, phono preamplifiers, compact disk players, digital video disk players, amplifiers, line stages, audio mixing boards, televisions, and video cassette recorders.

7. The apparatus of claim 1, wherein the heat source is the at least one audio semiconductor.

8. The apparatus of claim 1, wherein the substrate is thermally conductive.

9. The apparatus of claim 1, wherein the substrate comprises a material selected from the group consisting of metal, ceramic, and thermally conductive material, whereby the substrate is thermally conductive while providing electrical isolation to any connected electrical components.

10. The apparatus of claim 1, wherein at least one of the audio semiconductors is mounted as a conventional high-temperature package.

11. The apparatus of claim 1, wherein at least one of the audio semiconductors is mounted as bare dice with wire bond or other attachment technology.

12. The apparatus of claim 1, wherein at least one of the at least one audio semiconductor is mounted in a chip carrier or a direct attach package.

13. The apparatus of claim 1, wherein the apparatus is contained within a plastic sealed package.

14. A method for improving performance of an audio circuit, the method comprising the steps of: mounting at least one audio semiconductor directly to a surface of a substrate, said audio semiconductor having a desired high operating temperature, wherein the audio semiconductor and at least part of the substrate are located within a thermally insulating container capable of maintaining heat therein; and heating the substrate via use of a heat source that intentionally increases heat within the thermally insulating container to put the audio semiconductor in the desired operating temperature.

15. The method of claim 14, further comprising the step of regulating a temperature of the substrate using a temperature-measuring device and a feedback regulator located proximate to the substrate, the temperature-measuring device being in communication with the heat source.

16. The method of claim 14, wherein the step of heating the substrate via use of a heat source further comprises the step of maintaining at least a portion of the substrate at an above-ambient temperature.

17. The method of claim 14, further comprising the steps of mounting a plurality of circuit components at a location remote from the thermally insulating container, whereby the plurality of circuit components operate at approximately ambient temperature.

18. A system for improving performance of an audio circuit, comprising: a substrate; at least one audio semiconductor directly mounted to a surface of substrate and having a desired high operating temperature; means for thermally isolating the at least one audio semiconductor capable of maintaining heat therein; and means for heating the substrate wherein the means for heating the substrate intentionally increases heat within the means for thermally isolating the at least one audio semiconductor to put the audio semiconductor in the desired operating temperature.

19. The system of claim 18, further comprising means for regulating a temperature of the substrate.

20. The system of claim 19, wherein the means for regulating a temperature of the substrate is located within the means for thermally isolating the at least one audio semiconductor.

21. An apparatus, comprising: a thermally conductive substrate; at least one heat source located proximate to the substrate; at least one audio semiconductor mounted directly to a surface of the substrate and having a desired high operating temperature; and a heat dissipation device mounted proximate to the substrate, wherein the heat source intentionally increases heat of the substrate to put the audio semiconductor in the desired operating temperature.

22. The apparatus of claim 21, wherein the heat dissipation device is a heat sink.

23. The apparatus of claim 21, further comprising:
a temperature measuring device located proximate to the substrate; and
a feedback regulator electrically connected to the heat source and the temperature measuring device, whereby the feedback regulator controls the heat source.

24. The apparatus of claim 23, wherein the at least one audio semiconductor, the heat source, the temperature measuring device, and the feedback regulator are contained within at least one integrated circuit of at least one integrated circuit package.

25. The apparatus of claim 23, further comprising a fan, wherein the fan is controlled by the feedback regulator.

26. The apparatus of claim 23, further comprising a controlled vent, wherein the controlled vent is controlled by the feedback regulator.

27. The apparatus of claim 21, wherein at least one of the at least one audio semiconductor is mounted as a conventional high-temperature package.

28. The apparatus of claim 21, wherein at least one of the audio semiconductors is mounted as bare dice with wire bond or other attachment technology.

29. The apparatus of claim 21, wherein at least one of the audio semiconductors is mounted in a chip carrier or a direct attach package.

30. The apparatus of claim 21, further comprising a thermally-controlled interface located between the heat dissipation device and the substrate.

31. The apparatus of claim 21, wherein the heat source is the at least one audio semiconductor.

32. The apparatus of claim 21, wherein the heat source is a second audio semiconductor.

33. A method for improving performance of an audio circuit, the method comprising the steps of: mounting at least one audio semiconductor having a desired high operating temperature directly to a surface of a substrate; mounting the substrate to at least one heat dissipation device; and heating the substrate via use of a heat source that intentionally heats the substrate to put the audio semiconductor in the desired operating temperature.

34. The method of claim 33, further comprising the step of regulating a temperature of the substrate using a temperature-measuring device and a feedback regulator located proximate to the substrate, the temperature-measuring device being in communication with the heat source.

35. The method of claim 33, wherein the step of heating the substrate via use of a heat source further comprises the step of maintaining at least a portion of the substrate at an above-ambient temperature.

36. The method of claim 33, further comprising the step of automatically cooling the substrate with at least one fan in accordance with a temperature measurement of the substrate.

37. The method of claim 34, further comprising the step of cooling the substrate by controlling airflow across the substrate with controlled vents.

38. The method of claim 33, where the heat dissipation device is a heat sink.

* * * * *